(12) United States Patent
Osato

(10) Patent No.: US 7,688,094 B2
(45) Date of Patent: Mar. 30, 2010

(54) ELECTRICAL CONNECTING APPARATUS

(75) Inventor: Eichi Osato, Fuchu (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 492 days.

(21) Appl. No.: 11/606,547

(22) Filed: Nov. 29, 2006

(65) Prior Publication Data
US 2007/0069763 A1    Mar. 29, 2007

(30) Foreign Application Priority Data
Jul. 12, 2004    (WO) ............. PCT/JP2004/010247

(51) Int. Cl.
*G01R 31/02* (2006.01)
(52) U.S. Cl. ............................................ 324/755
(58) Field of Classification Search ............ 324/765, 324/754, 761–762, 158.1; 439/66, 83, 78–85; 257/48; 438/14–18
See application file for complete search history.

(56) References Cited

U.S. PATENT DOCUMENTS

| | | |
|---|---|---|
| 5,742,487 A | 4/1978 | Kobayashi et al. |
| 5,531,608 A | 7/1996 | Abe |
| 5,998,228 A * | 12/1999 | Eldridge et al. ............... 438/15 |
| 6,489,790 B1 * | 12/2002 | An et al. ..................... 324/755 |
| 6,535,002 B2 * | 3/2003 | Haseyama et al. .......... 324/754 |
| 6,958,616 B1 * | 10/2005 | Mahoney et al. ............ 324/754 |

FOREIGN PATENT DOCUMENTS

| | | |
|---|---|---|
| JP | 63-299257 | 12/1988 |
| JP | 4-155790 | 5/1992 |
| JP | 07-299949 | 8/1995 |
| JP | 7-240262 | 9/1995 |
| JP | 8-213794 | 8/1996 |

* cited by examiner

*Primary Examiner*—Ha Tran T Nguyen
*Assistant Examiner*—Tung X Nguyen
(74) *Attorney, Agent, or Firm*—Black, Lowe & Graham

(57) ABSTRACT

In an electrical connecting apparatus, a first guide is arranged in a plate-shaped lower base in which the contactors are arranged. The first guide has a first space for guiding a device under test so that its electrodes will contact the tips of contactors and for positioning the device under test against the contactors. The device under test is guided to the first space by second guides and is received and thrust by the tips of the contactors. By doing so, displacement of the device under test caused by displacement of the upper base or the second guides is prevented.

10 Claims, 8 Drawing Sheets

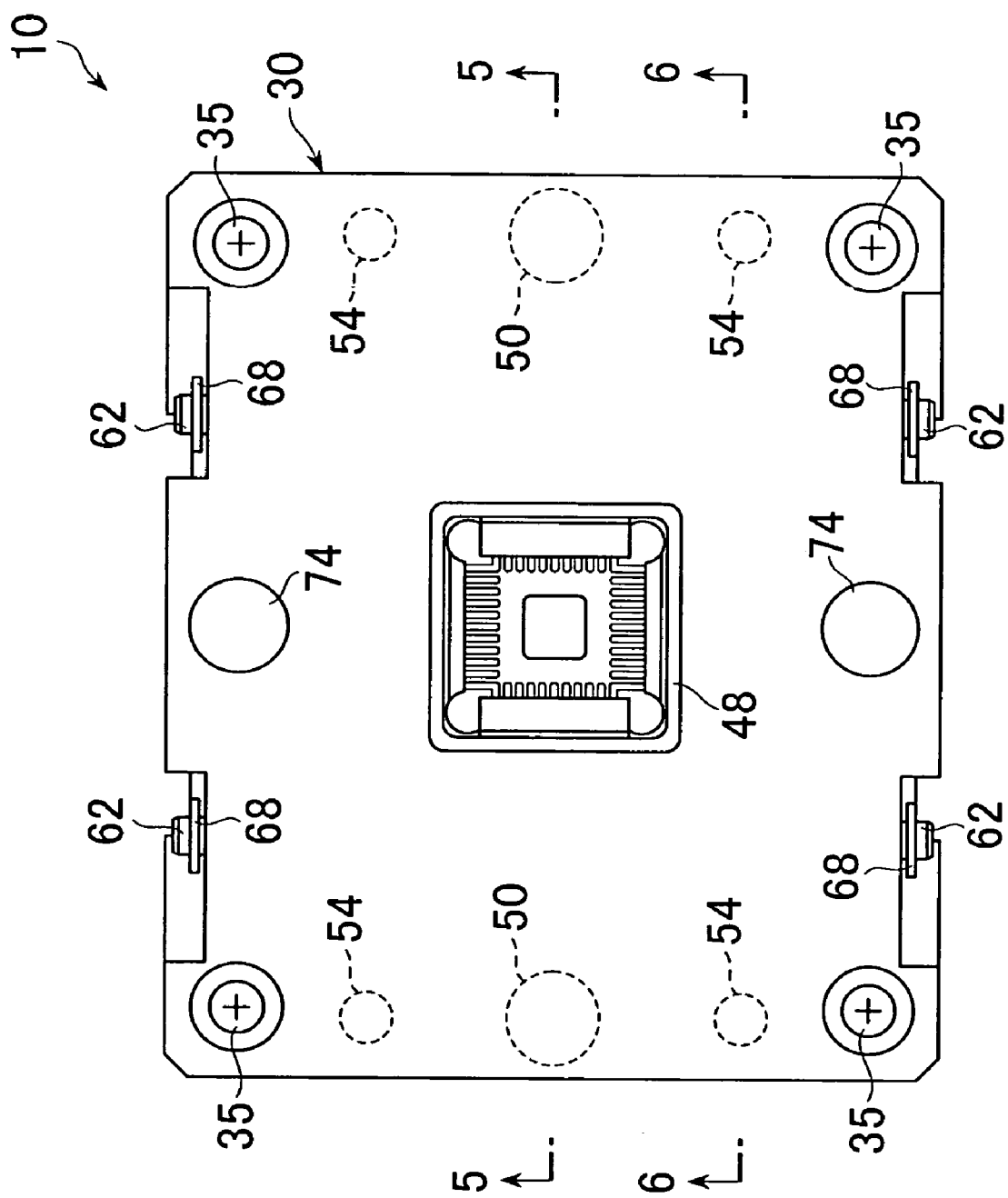
Figure No. 1

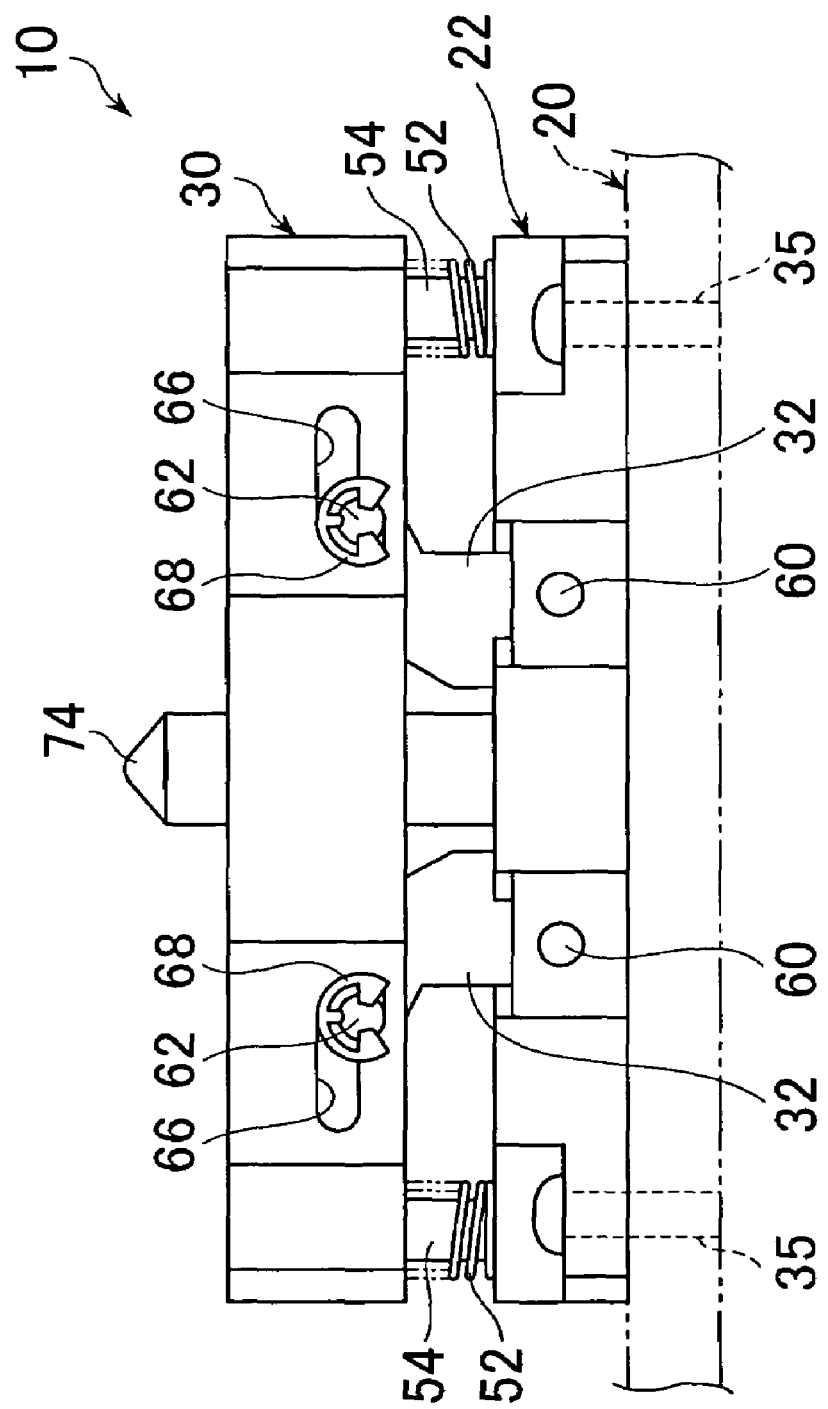
Figure No. 2

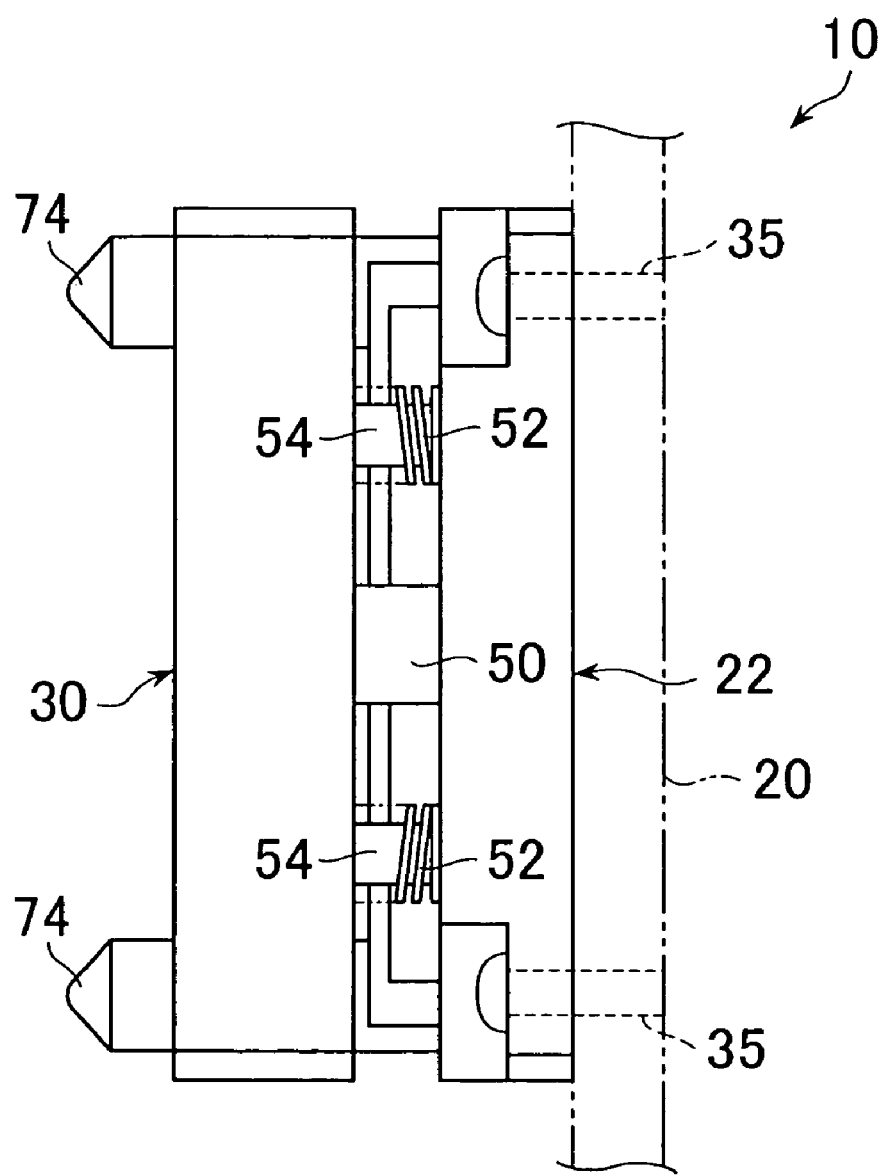
Figure No. 3

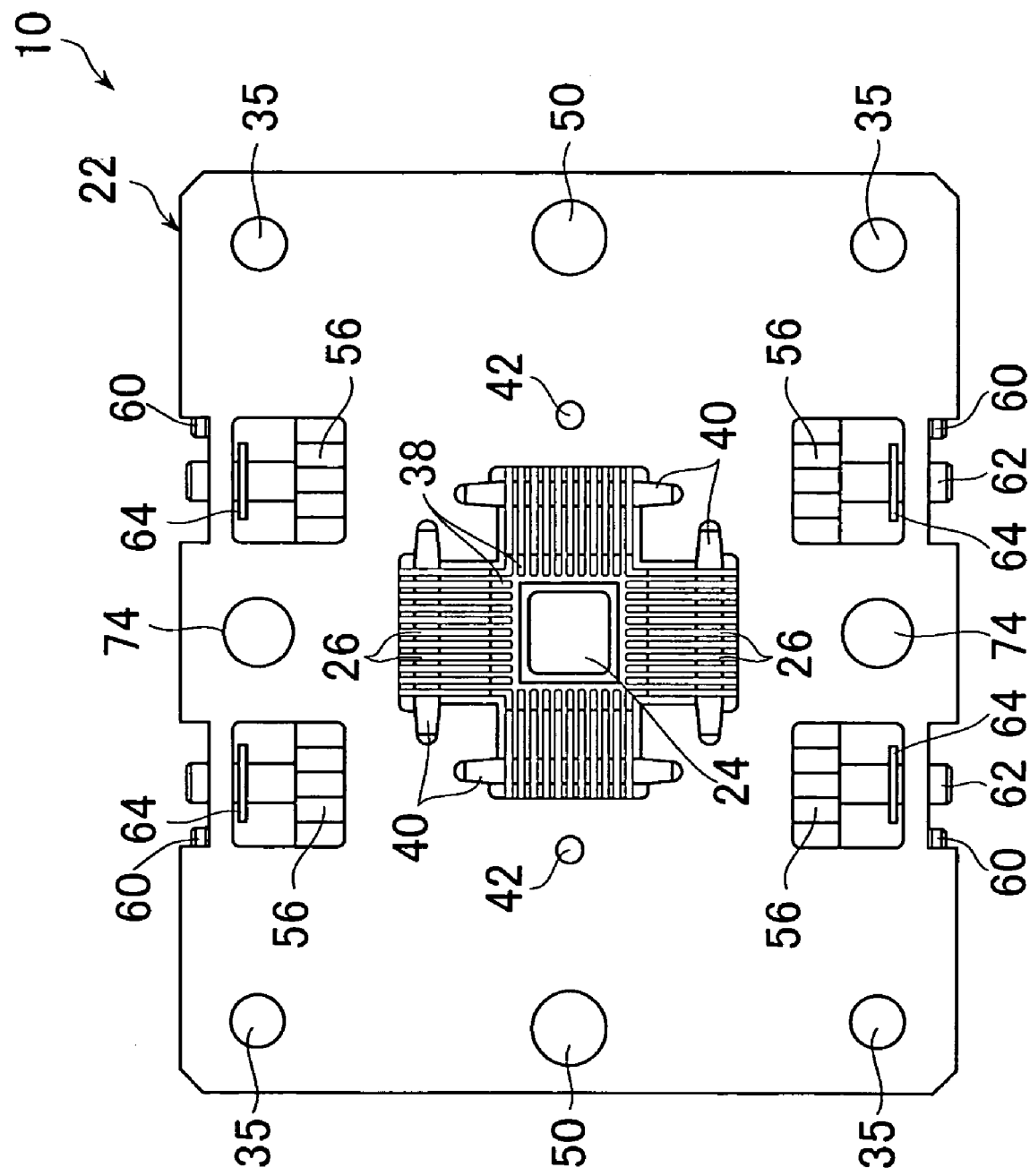
Figure No. 4

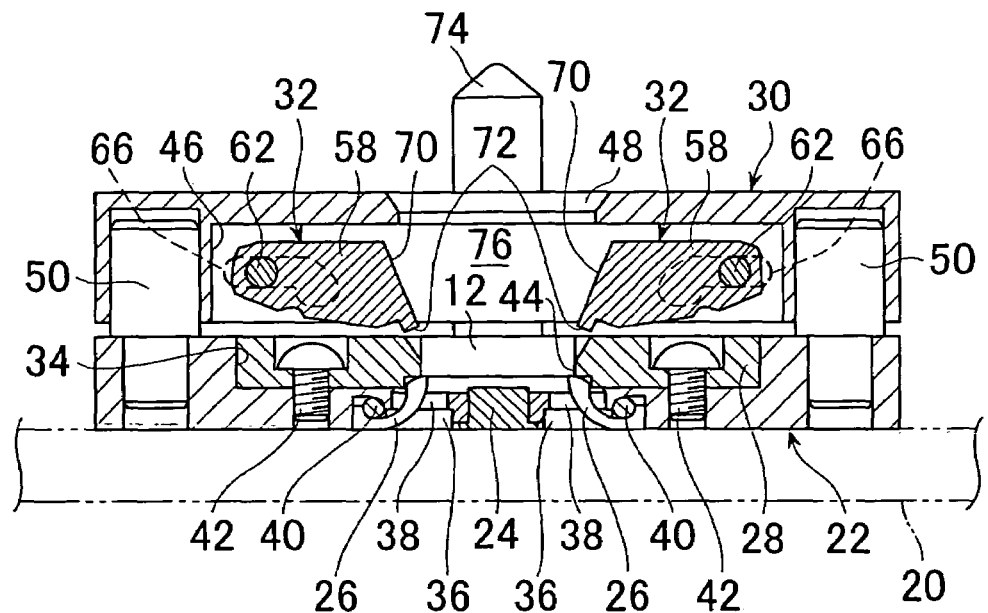
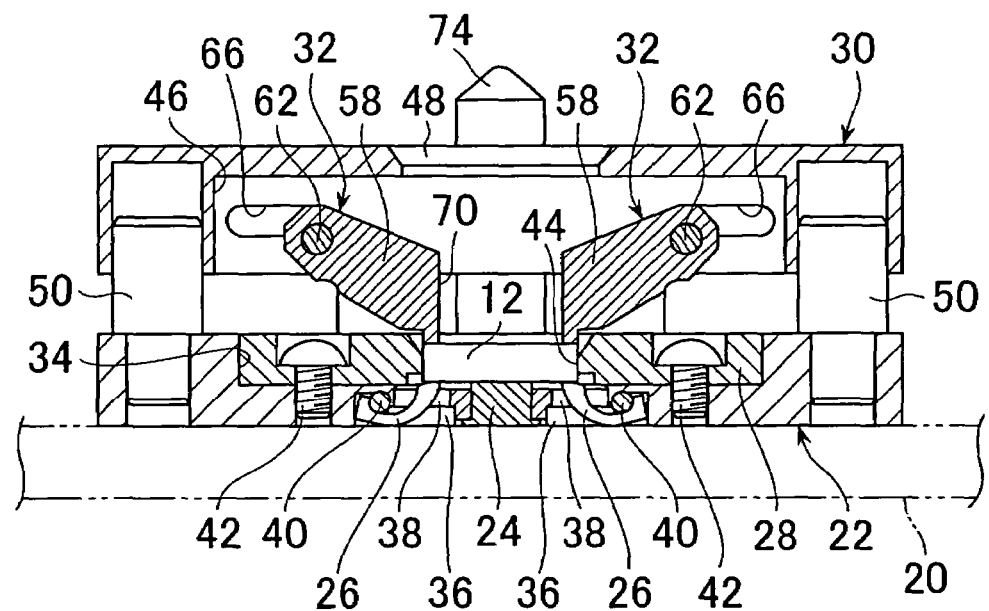
Figure No. 5

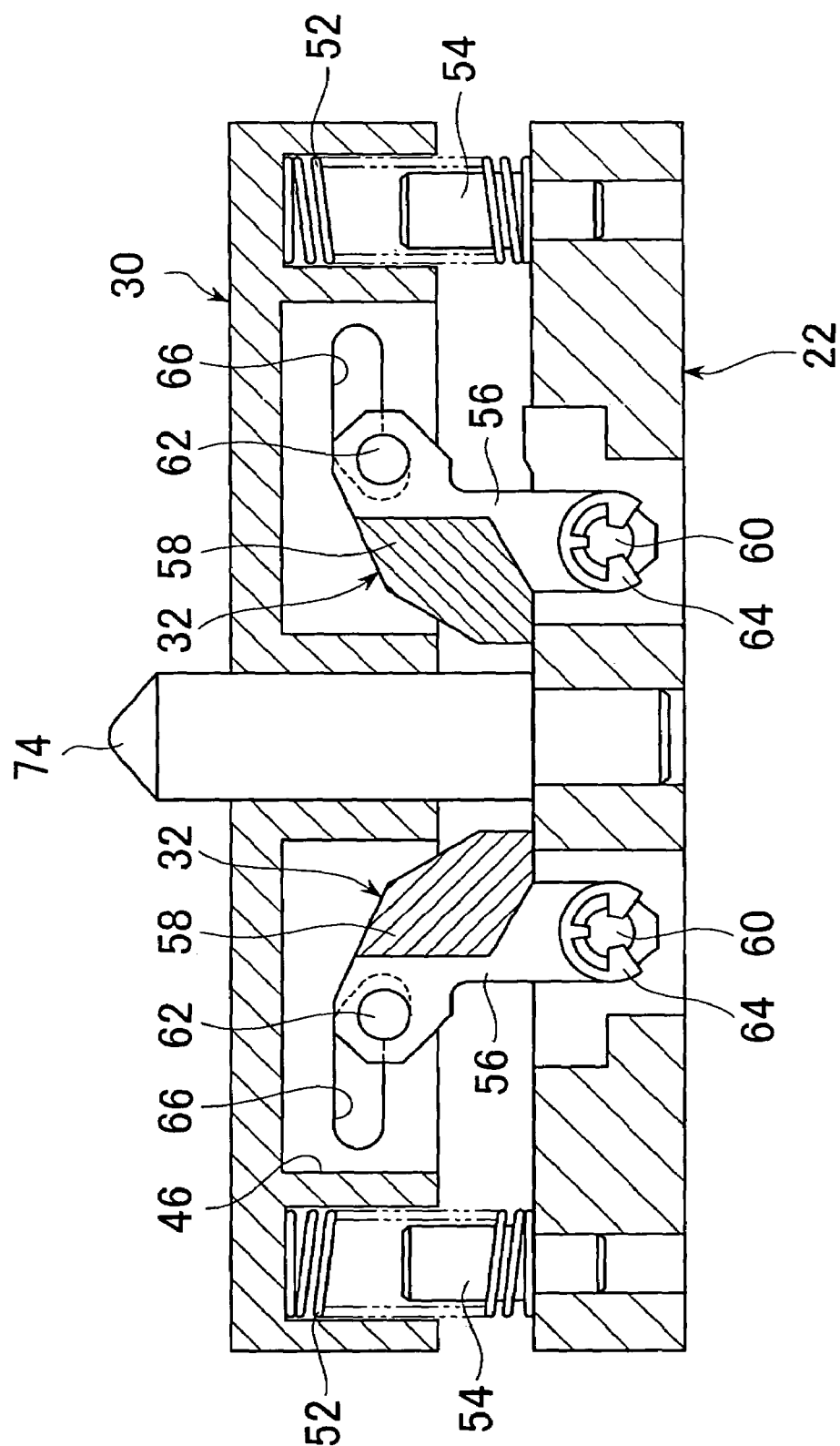
Figure No. 6

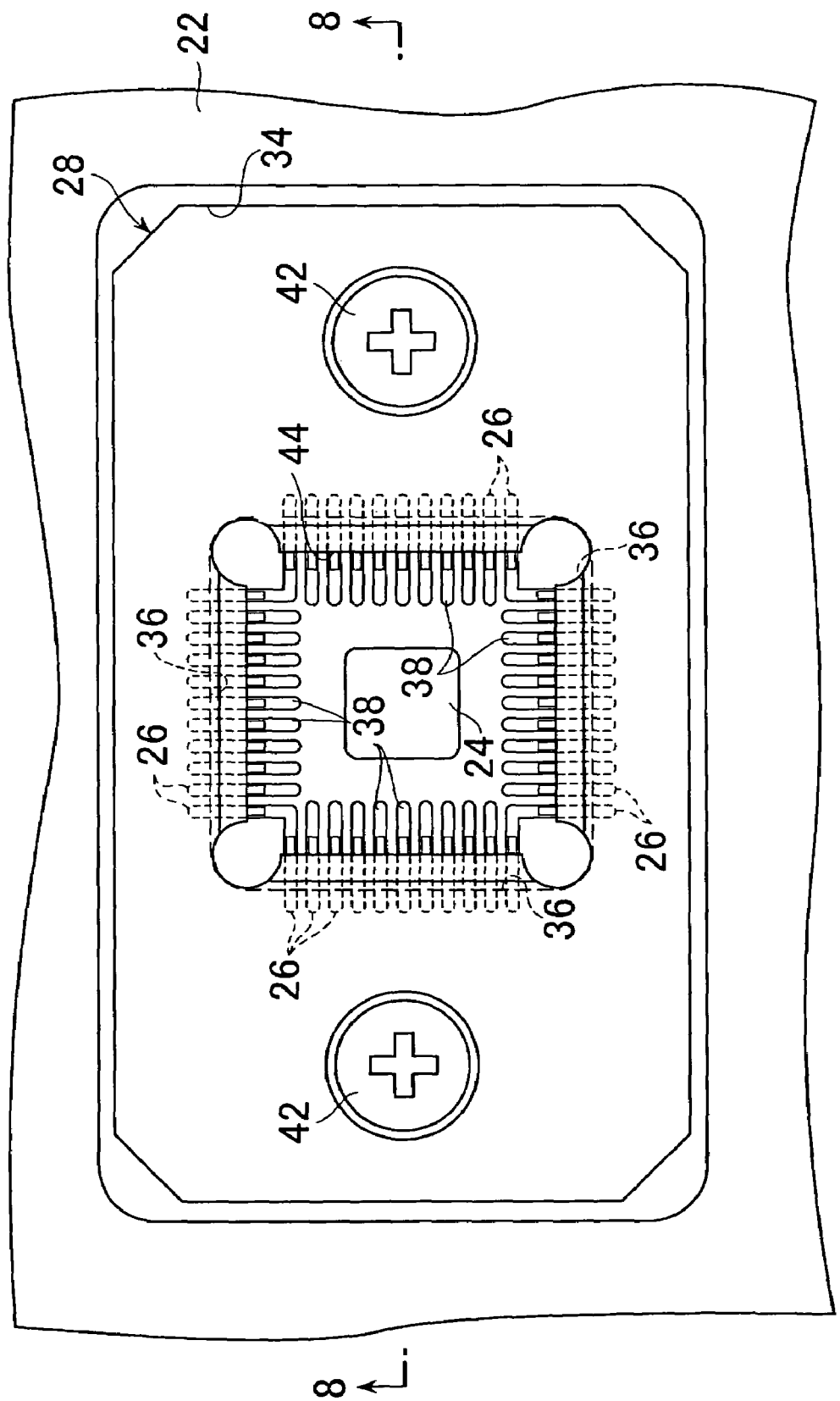
Figure No. 7

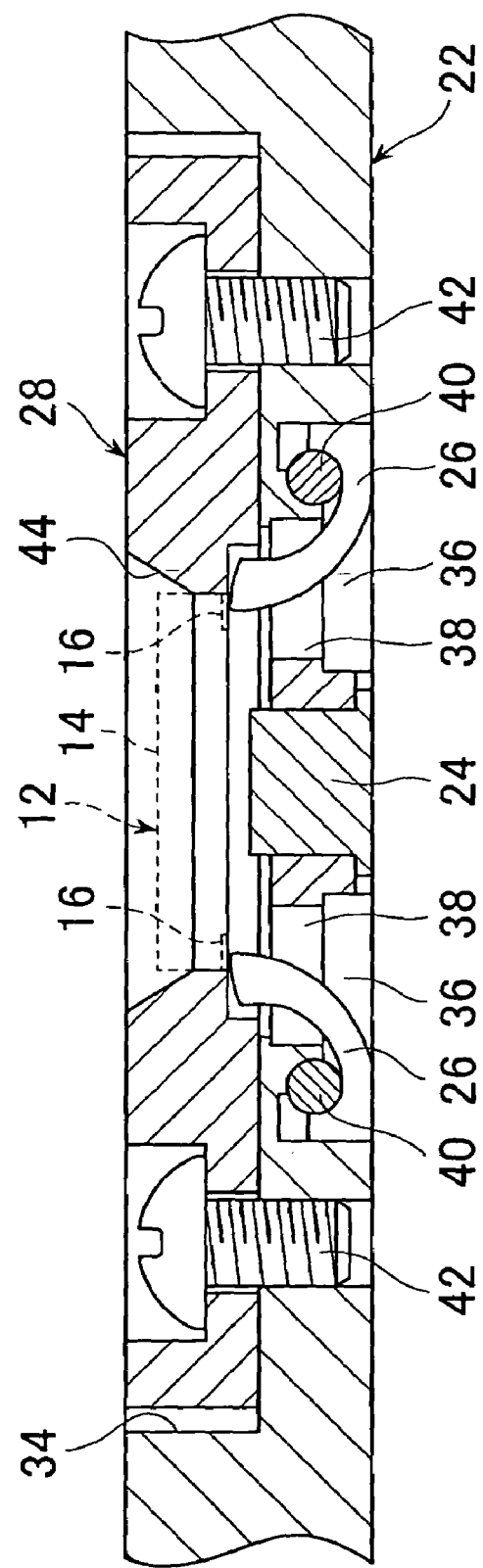
Figure No. 8

ELECTRICAL CONNECTING APPARATUS

CROSS REFERENCE TO RELATED APPLICATIONS

This application claims the priority benefit of copending PCT/JP2004/010247, filed Jul. 12, 2004, which is incorporated herein by reference.

TECHNICAL FIELD

The present invention relates to an electrical connecting apparatus for use as an auxiliary apparatus in an electrical test of a semiconductor device such as an integrated circuit.

BACKGROUND ART

In general, an inspection or a test of electrical characteristics of a packaged or molded semiconductor device, more particularly, an integrated circuit (IC) is performed by utilizing as an auxiliary apparatus an electrical connecting apparatus such as an inspection socket, that is, a test socket to which a semiconductor device is removably attached.

There is provided an electrical connecting apparatus of such a type including an IC holder that can hold an IC as a device under test having a plurality of lead electrodes, and a contactor holder in which a plurality of contactors (probe needles) are arranged so that the arrangement of their tips corresponds to that of the lead electrodes, wherein the IC holder holding the IC is attached to the contactor holder to be positioned, and the lead electrodes are contacted with the contactors respectively (Reference Document 1).

[Reference Document 1]: Japanese Patent Application. Disclosure No. 7-229949

In the aforementioned conventional electrical connecting apparatus, the IC holder comprises a receptacle for receiving the IC, a pair of upper guides having a flat upper guiding surface for guiding the IC supplied from its upper side toward the receptacle, and a pair of lower guides having an arc-shaped lower guiding surface for guiding the IC guided by the upper guide further accurately to the receptacle.

When the IC holder is pushed down to the contactor holder, both of the upper guides are opened to effect the function of the upper guiding surface. When the IC holder is pulled up from the contactor holder, the upper guides are swung along the arc-shaped lower guiding surface so that they contact the lead electrodes of the IC and thrust the lead electrodes to the tips of the contactors.

The IC is moved together with the IC holder. When the IC holder is lowered to the vicinity of the lowest position, the lead electrodes of the IC begin to be thrust to the tips of the contactors by the upper guides. With the IC itself being thrust to the receptacle, or with the lead electrodes being thrust by the tips of the contactors, movement or displacement of the IC against the contactors is stopped.

However, in the above electrical connecting apparatus, since the receptacle and the lower guides are provided in the IC holder that moves up and down against the contactor holder, the IC received on the receptacle may be displaced against the receptacle due to vibration caused by the movement of the IC holder or the angular rotation of the lower guides etc., and the lead electrodes of the IC may be thrust to the tips of the contactors under such a state. In such a case, the lead electrodes of the IC will not contact the tips of the contactors accurately, and thus no accurate test will be performed.

To solve the above problem, the above conventional electrical connecting apparatus is configured such that the lower guides position the IC to the receptacle and also the contactors.

However, the dimensional accuracy of a sealed IC has slight tolerance resulting from various causes such as the dimensional accuracy of a die used for a package or a mold. Thus, there exists slight difference in dimension among ICs of the same type.

If such ICs are tested on the above conventional electrical connecting apparatus, some ICs will be displaced against the contactors along with the movement of the IC holder.

SUMMARY OF THE DISCLOSURE OF THE INVENTION

Problems to be Solved by the Invention

It is an object of the present invention to prevent the displacement of a device under test against a contactor.

Means to Solve the Problems

An electrical connecting apparatus according to the present invention comprises: a plate-shaped lower base; a plurality of contactors arranged in the lower base, each contactor having a tip to be contacted to one of a plurality of electrodes on a device under test; a first guide arranged in the lower base and having a space for guiding the device under test so that its electrodes will contact the tips of the contactors and for positioning the device under test against the contactors, a plate-shaped upper base coupled with the lower base to be movable in up and down directions and having an opening for permitting passing of the device under test; and a pair of second guides arranged to be opposed to each other on the upper side of the first guide. The second guides guide the device under test supplied via the opening to the space when the upper base is moved downward to the lower base, and thrust the device under test in the space to the tips of the contactors when the upper base is moved upward from the lower base. The plurality of contactors are exposed to the space at their tips.

EFFECT OF THE INVENTION

According to the present invention, the first guide is arranged in the lower base, and the device under test is received by the tips of the contactors. Accordingly, even when the upper base or the second guides are displaced against the lower base, the first guide, contactors and device under test are not displaced, and thus displacement of the device under test caused by displacement of the upper base or the second guides is prevented.

The first guide may be removably mounted in the lower base. By doing so, the first guide can be replaced with an optimal first guide in accordance with the degree of the variety in the dimensional accuracy of the device under test, or the first guide can be replaced with another first guide having different dimensions from those of this first guide for use in testing of another device under test having different dimensions.

The lower base may have a first hollow opened upward, and the first guide may be formed in a plate shape and be arranged in the first hollow.

The electrical connecting apparatus according to the present invention may further comprise a pedestal removably arranged in the lower base, penetrating the lower base in up and down directions, and protruded to the space at its upper end. By doing so, the overdrive amount can be adjusted by changing the protruding amount of the pedestal to the space or by replacing the pedestal with another pedestal having different protruding amount to the space.

The lower base may further have a plurality of slots through which the plurality of contactors respectively pass with their tips exposed to the space. By doing so, the adjacent contactors are prevented from contacting to each other, and the contactors are stabilized.

The pair of second guides may be connected to the lower base and the upper base to enable pivotal movement around axes extending in the horizontal direction and be connected to the upper base to be movable horizontally in a direction perpendicular to the axes. By doing so, the second guides are reliably displaced along with up and down movement of the upper base.

The upper base may further have a second hollow opened downward and communicating with the opening, and the second guide may be connected to the upper base at its upper end portion with the upper end portion placed in the second hollow. By doing so, the second hollow can be used as a space to receive most part of the second guide.

The electrical connecting apparatus according to the present invention may further comprise a plurality of elastic bodies for biasing the upper base upward from the lower base.

The contactor may have an outer surface curved in an arc shape and be formed in a J shape.

The electrical connecting apparatus according to the present invention may further comprise a wiring board having a plurality of conductive portions on its upper surface and on which the lower base is mounted, and an elastic body arranged in the lower base to thrust the contactor in a state where the outer surface is contacted with the conductive portion.

BRIEF DESCRIPTION OF THE DRAWINGS

FIG. 1 is a plan view showing an embodiment of an electrical connecting apparatus according to the present invention, in a state where a wiring board has been removed.

FIG. 2 is a front view of the electrical connecting apparatus shown in FIG. 1.

FIG. 3 is a right side view of the electrical connecting apparatus shown in FIG. 1.

FIG. 4 is a bottom view of the electrical connecting apparatus shown in FIG. 1, in a state where the wiring board has been removed.

FIG. 5 is cross-sectional views obtained along the 5-5 line in FIG. 1; (A) shows a state where an upper base is moved downward, and (B) shows a state where the upper base is moved upward.

FIG. 6 is a cross-sectional view obtained along the 6-6 line in FIG. 1.

FIG. 7 is a plan view of the vicinity of a place where a first guide and contactors are arranged.

FIG. 8 is a cross-sectional view obtained along the 8-8 line in FIG. 7.

DESCRIPTION OF THE SYMBOLS

10: electrical connecting apparatus
12: device under test
14: main body
16: electrode
20: wiring board
22: lower base
24: pedestal
26: contactor
28: first guide
30: upper base
32: second guide
34, 46: first and second hollows
38: slot
44, 76: first and second space
48: opening
50: guide pin
52: elastic body
54: supporting pin
56: swing portion
58: guide portion
60, 62: shaft
66: elongated hole
70: guide surface
72: thrust surface
74: guide pin

BEST MODE FOR CARRYING OUT THE INVENTION

Referring to FIGS. 1 to 8, an electrical connecting apparatus 10 is used for an electrical test to which a semiconductor device is subjected as a device under test 12. The device under test 12 includes a plate-shaped main body 14 packaged or molded in a rectangular flat shape and a plurality of electrodes 16 formed on the lower surface of the main body 14 (refer to FIG. 8).

These electrodes 16 are divided into four electrode groups respectively corresponding to four sides of the rectangle a one-to-one relationship in each of which the electrodes are spaced from each other and arranged in a direction along each corresponding side. Each electrode 16 is positioned at an inner portion of the corresponding side and is in a plate shape extending in a direction perpendicular to the corresponding side.

The electrical connecting apparatus 10 includes a wiring board 20 functioning as a base plate, a plate-shaped lower base 22 disposed on the wiring board 20, a pedestal 24 provided in the lower base 22, a plurality of contactors 26 provided in the lower base 22, a first guide 28 provided in the lower base 22, a plate-shaped upper base 30 provided on the lower base 22 to be movable in up and down directions, and a pair of second guides 32 coupled with both of the upper and lower bases 30 and 22.

The wiring board 20 has a plurality of wires (not shown in figure) formed thereon. These wires are divided into four wire groups corresponding to the electrode groups of the device under test 12 (i.e., respective sides of the rectangle) in a one-to-one relationship. Wires of each wire group extend in parallel from the center side of the wiring board 20 toward the corresponding side and are spaced to each other in a direction perpendicular to the corresponding side.

The lower base 22 is in a rectangular flat shape and has a first hollow 34 opened upward. The first hollow 34 is formed in a shape of a shallow box with inner space and has a flat bottom surface.

The lower base 22 is removably attached to the wiring board 20 by a plurality of screw members 35 penetrating the lower base 22 and screwed into the wiring board 20 in a state of being positioned to the wiring board 20 by a plurality of positioning pins not shown in figure.

The pedestal 24 penetrates the center of the lower base 22 from the lower to upper side, and its upper end portion is protruded to the first hollow 34. The pedestal 24 is prevented from dropping from the lower base 22 since the lower base 22 is attached to the wiring board 22.

The lower base 22 also has four recesses 36 opened downward and a plurality of slots 38 communicating with the first hollow 34 and the recesses 36.

The recesses 36 are positioned around the pedestal 24 to correspond to the respective sides of the rectangle in one-to-one relationship and are extend in a direction along the corresponding sides. Each recess 36 corresponds to a set of the electrode group and the wire group in a one-to-one relationship.

The slots 38 are divided into four slot groups each communicating with one recess 36. Each slot group corresponds to a set of the electrode group, the wire group, and the recess 36 in a one-to-one relationship. Slots 38 of each slot group are spaced in a direction along the corresponding side and extend in a direction perpendicular to the corresponding side.

Each contactor 26 has an outer surface curved in an arc shape from its tip end side to its rear end side and is formed substantially in a J shape. Each contactor 26 is disposed on the lower base 22 in a state in which its rear end portion is positioned in the corresponding recess 36, and its tip end portion passes through the slot 38 so that the tip end will be protruded to the first hollow 34. Thus, the adjacent contactors 26 are prevented from contacting to each other, and the contactors 26 are stabilized.

The contactors 26 are also divided into four contactor groups each corresponding to a set of the electrode group, the wire group, the recess and the slot group in a one-to-one relationship. The contactors 24 of each contactor group direct their tips (needle tips) to the opposed contactor group, direct their arc-shaped outer surfaces to the wiring board 20, and are spaced in a direction along the corresponding side.

The contactors 26 of each contactor group are prevented from dropping from the lower base 22 as a part of the arc-shaped outer surface of each contactor is, in a state in which the lower base 22 is attached to the wiring board 20, thrust to the wire on the wiring board 20 by an elastic member 40 provided on the bottom of the corresponding recess 36. The elastic member 40 is made of a rubber material such as a silicone rubber and formed in a bar shape and extends within the recess 36 in a longitudinal direction of the recess 36.

The first guide 28 is formed substantially in a rectangular plate shape and is disposed in the first hollow 34. The first guide 28 is removably attached to the lower base 22 by a plurality of screw members 42 penetrating the first guide 28 and screwed into the lower base 22 in a state of being positioned to the lower base 22 by a plurality of positioning pins not shown in figure.

The first guide 28 has at its center a rectangular flat-shape first space 44 to receive the device under test 12 supplied from above. The slots 38 penetrate the lower base 22, and are opened to the first space 44. The pedestal 24 and the contactors 26 are exposed to the first space 44 at their tips (upper ends).

Of the inner surface forming the first space 44, the upper half portion acts as a guide surface for guiding the device under test 12 to a correct position against the tips of the contactors 26, and the lower half portion acts as a positioning surface for positioning the device under test 12 to the tips of the contactors 26. Thus, the first space 44 functions as a guiding and positioning space for guiding and positioning the device under test 12.

The upper base 30 is in a rectangular flat shape sized approximately as large as the lower base 22 and has a second hollow 46 opened downward and an opening 48 communicating the second hollow 46 with upper space.

The second hollow 46 is formed in a shape of a shallow box with inner space and has a flat bottom surface. The second hollow 46 is larger and deeper than the first hollow 34.

The opening 48 is in a rectangular flat shape sized larger than the device under test 12. The inner surface forming the opening 48 acts as a guide surface for guiding the device under test 12 supplied from above to the second guides 32 accurately.

The upper base 30 is coupled with the lower base 22 to be movable in up and down directions by a plurality of guide pins 50 attached to the lower base 22 in a state of extending upward from the lower base 22 and is biased upward by a plurality of elastic bodies 52 arranged between the lower base 22 and the upper base 30.

The elastic bodies 52 form a compression coil spring in the example shown in figure and receive the upper portion of a supporting pin 54 attached to the lower base 22 in a state of extending upward from the lower base 22.

The second guides 32 are between the first guide 28 and the opening 48 and are arranged to be opposed to each other spaced in one direction in the horizontal surface. Each of the second guides 32 has a pair of swing portions 56 bent in an L shape and a guide portion 58 connecting both of the swing portions 56 to each other.

One end portion of each of the paired swing portions 56 is connected to the lower base 22 to be swingable thereat by a shaft 60 penetrating in the other direction in the horizontal surface, and the other end portion is connected to the upper base 30 to be swingable thereat by a shaft 62 penetrating in the other direction in the horizontal surface.

The shaft 60 swingably supports both of the paired swing portions 56 attached to the lower base 22 and is prevented from coming off from the lower base 22 by a pair of retaining rings 64.

On the other hand, the shaft 62 is movably received in two elongated holes 66 formed on the upper base 30 and is prevented from coming off from the upper base 30 by a pair of retaining rings 68.

Each elongated hole 66 extends in one direction in the horizontal surface (separation direction between the second guides 32), and its end portion on the opposite second guide 32 side (center side of the upper base 30) is bent downward. That is, in FIG. 5 (A), the left elongated hole 66 is bent downward at its right end portion, and the right elongated hole 66 is bent downward at its left end portion.

Instead of the pivot support of the second guides 32 by the shafts 60 or 62, the second guides 32 may be pivot-supported by using pivot pins.

The guide portion 58 of each second guide 32 extends in the other direction in the horizontal surface and is swung integrally with both of the swing portions 56.

The guide portion 58 of each second guide 32 has a guide surface 70 for guiding the device under test 12 supplied via the opening 48 to the first space 44 and a thrust surface 72 for thrusting the device under test 12 in the first space 44 so that its electrodes 16 will contact the tips of the contactors 26.

The electrical connecting apparatus 10 further includes a pair of guide pins 74 for positioning the electrical connecting apparatus 10 with a carrier (not shown in figure) for carrying the device under test 12. Each guide pin 74 is attached to the lower base 22 in a state of extending in upward from the lower base 22, penetrates the upper base 30, and is protruded upward from the upper base 30 at its upper end portion.

In the electrical connecting apparatus 10, the upper base 30 is always in an upward state by the biasing force of the elastic bodies 52 as shown in FIG. 5 (B). Accordingly, the second guides 32 are inclined so that a second space 76 is closed and so that the guide surfaces 70 do not function, with their guide portions 58 protruded downward from the second hollow 46, since the end portions of each shaft 62 are received in the downward-bent end portions of the elongated holes 66.

However, when the upper base 30 is moved downward against the spring force, that is, the biasing force, of the elastic bodies 52, the second guides 32 are angularly rotated as the end portions of the shafts 62 first move upward from the downward-bent end portions of the elongated holes 66 and then move horizontally in the elongated holes 66.

As a result, the second guides 32 eventually open the second space 76 so that the guide surfaces 70 will guide the device under test 12 toward the first space 44, as shown in FIG. 5 (A).

In a test, the carrier carrying the device under test 12 first holds the device under test 12 with the electrodes 16 facing downward and is moved to the upper side of the electrical connecting apparatus 10 in such a state.

The carrier then receives the guide pins 74 in its own positioning holes. Thus, the carrier is positioned with the electrical connecting apparatus 10.

The carrier then pushes by a pusher provided therein the upper base 30 downward against the biasing force of the elastic bodies 52. Thus, the second guides 32 are angularly rotated as the end portions of the shafts 62 first move upward from the downward-bent end portions of the elongated holes 66 and then move horizontally in the elongated holes 66.

As a result, the second guides 32 eventually open the second space 76 so that the guide surfaces 70 will exert their function reliably, as shown in FIG. 5 (A). In this state, the guide portions 58 of the second guides 32 are housed in the second hollow 46.

In the above state, the device under test 12 is released from the carrier. Accordingly, the device under test 12 drops, is received by the guide surfaces 70 via the opening 48, and is guided to the first space 44 by the guide surfaces 70.

In the first space 44, the device under test 12 is guided so that the electrodes 16 will contact the tips of the contactors 26, is positioned against the contactors 26, and is eventually received by the tips of the contactors 26.

Subsequently, the carrier releases pushing of the upper base 30. As a result, since the upper base 30 is moved upward by the elastic bodies 52 as shown in FIG. 5 (B), the second guides 32 are angularly rotated to let the guide surfaces 70 lose their function, close the second space 76, and push down the device under test 26 by the thrust surfaces 72.

When the upper base 30 is moved upward, and the second guides 32 are angularly rotated as described above, the first guide 28, contactors 26 and device under test 12 are not displaced since the device under test 12 is pushed to the tips of the contactors 26. Thus, displacement of the device under test 12 caused by displacement of the upper base 30 or the second guides 32 is prevented.

As a result of the above, the device under test 12 is energized and tested in a state in which its electrodes 16 are thrust to the tips of the contactors 26 accurately.

In a state where the device under test 12 is pushed down by the second guides 32, overdrive acts in the contactors 26. The overdrive amount is defined mainly by the biasing force of the elastic bodies 52. However, the overdrive amount can be adjusted by changing the protruding amount of the pedestal 24 to the first space 44 or by replacing the pedestal 24 with another pedestal having different protruding amount to the first space 44, in advance.

In a case where the dimensional accuracy of the device under test 12 varies excessively, an optimal first guide 28 is mounted in the lower base 22 in advance in accordance with the degree of the variety. Also, in a case where a device under test having different dimensions is to be tested, a first guide 28 having dimensions appropriate for the dimensions of the new device under test is mounted in the lower base 22 in advance.

In the above electrical connecting apparatus 10, since both of the second guides 32 are connected to the lower base 22 and the upper base 30 to enable pivotal movement and are connected to the upper base 30 to be movable in directions in which the second guides 32 are separated, the second guides 32 are reliably displaced along with up and down movement of the upper base 30.

INDUSTRIAL APPLICABILITY

The electrical connecting apparatus 10 may be used in an upside-down state or in an inclined state in which the longitudinal direction of the guide pins 74 will be inclined.

The present invention is not limited to the above embodiments, but can be altered without departing from the spirit of the present invention.

What is claimed is:

1. An electrical connecting apparatus comprising:
a plate-shaped lower base;
a plurality of contactors arranged in said lower base, each contactor having a to be contacted to one of a plurality of electrodes on a device under test;
a first guide arranged in said lower base and having a space for guiding said device under test so that its electrodes will contact the tips of said contactors and for positioning said device under test against said contactors;
a plate-shaped upper base coupled with said lower base to be movable in up and down directions and having an opening for permitting passing of said device under test;
a pair of second guides arranged to be opposed to each other on the upper side of said first guide, the second guides guiding the device under test supplied via said opening to said space when said upper base is moved downward to said lower base and thrusting the device under test in said space to the tips of said contactors when said upper base is moved upward from said lower base, and;
a pedestal removably arranged in said lower base, penetrating said lower base in up and down directions and protruded to said space at its upper end, wherein said plurality of contactors are exposed to said space at their tips.

2. The electrical connecting apparatus according to claim 1, wherein said first guide is removably mounted in said lower base.

3. The electrical connecting apparatus according to claim 1, wherein said lower base has a first hollow opened upward, and said first guide is formed in a plate shape and is arranged in said first hollow.

4. The electrical connecting apparatus according to claim 1, wherein said second guides are spaced apart in one direction within a horizontal plane and supported swingably on said upper base and lower base, further comprising a guide surface for guiding a device under test to be supplied via said opening when said upper base is lowered relative to said lower base, and a thrusting portion for thrusting said device under test in said space to the tips of said contactors when said upper base is raised relative to said lower base.

5. The electrical connecting apparatus according to claim 1, wherein said lower base has a plurality of slots through which said plurality of contactors respectively pass with their tips exposed to said space.

6. The electrical connecting apparatus according to claim 1, wherein said pair of second guides are connected to said lower base and said upper base to enable pivotal movement around axes extending in the horizontal direction and are connected to said upper base to be movable horizontally in a direction perpendicular to said axes.

7. The electrical connecting apparatus according to claim 1, wherein said upper base further has a second hollow opened downward and communicating with said opening, and said second guide is connected to said upper base at its upper end portion with said upper end portion placed in said second hollow.

8. The electrical connecting apparatus according to claim 1 further comprising a plurality of elastic bodies for biasing said upper base upward from said lower base.

9. The electrical connecting apparatus according to claim 1, wherein said contactor has an outer surface curved in an arc shape and is formed in a J shape.

10. The electrical connecting apparatus according to claim 9, further comprising a wiring board having a plurality of conductive portions on its upper surface and on which said lower base is mounted; and an elastic body arranged in said lower base to thrust said contactor in a state where said outer surface is contacted with said conductive portion.

* * * * *

UNITED STATES PATENT AND TRADEMARK OFFICE
CERTIFICATE OF CORRECTION

| | | |
|---|---|---|
| PATENT NO. | : 7,688,094 B2 | Page 1 of 1 |
| APPLICATION NO. | : 11/606547 | |
| DATED | : March 30, 2010 | |
| INVENTOR(S) | : Eichi Osato | |

It is certified that error appears in the above-identified patent and that said Letters Patent is hereby corrected as shown below:

In column 8, line 31 (Claim 1, line 4), replace the phrase "having a to be contacted" with the phrase -- having a tip to be contacted --.

Signed and Sealed this

Fifteenth Day of June, 2010

David J. Kappos
*Director of the United States Patent and Trademark Office*